United States Patent [19]
Lim et al.

[11] Patent Number: 6,124,170
[45] Date of Patent: Sep. 26, 2000

[54] METHOD FOR MAKING FLASH MEMORY

[75] Inventors: Min Gyu Lim; Eun Jeong Park, both of Chungcheongbuk-do, Rep. of Korea

[73] Assignee: LG Semicon Co., Ltd., Chungcheongbuk-Do, Rep. of Korea

[21] Appl. No.: 09/017,926

[22] Filed: Feb. 3, 1998

Related U.S. Application Data

[62] Division of application No. 08/807,979, Mar. 3, 1997.

[30] Foreign Application Priority Data

Apr. 12, 1996 [KR] Rep. of Korea .................. 96-11064

[51] Int. Cl.[7] .............................................. H01L 21/8247
[52] U.S. Cl. ........................... 438/267; 438/304; 438/596
[58] Field of Search .................................. 438/257, 264, 438/266, 267, 304, 595, 596

[56] References Cited

U.S. PATENT DOCUMENTS

| | | | |
|---|---|---|---|
| 4,714,519 | 12/1987 | Pfiester | 438/596 |
| 5,063,423 | 11/1991 | Fujii et al. | 257/316 |
| 5,081,057 | 1/1992 | Corda | 438/596 |
| 5,268,585 | 12/1993 | Yamauchi | 438/267 |
| 5,434,813 | 7/1995 | Tamura et al. | 257/316 |
| 5,554,552 | 9/1996 | Chi | 438/264 |
| 5,753,952 | 5/1998 | Mehrad | 438/264 |

*Primary Examiner*—Chandra Chaudhari

[57] ABSTRACT

A flash memory is disclosed including a second conductivity-type substrate having first conductivity-type first and second impurity regions spaced apart from each other by a predetermined distance; a second conductivity-type floating gate formed above part of the first impurity region; a first conductivity-type floating gate formed over the second conductivity-type floating gate; and an insulating layer and first conductivity-type control gate sequentially formed on the first conductivity-type floating gate.

13 Claims, 7 Drawing Sheets

METHOD FOR MAKING FLASH MEMORY

This application is a divisional of copending application Ser. No. 08/807,979, filed on Mar. 3, 1997, the entire contents of which are hereby incorporated by reference.

BACKGROUND OF THE INVENTION

The present invention relates to a semiconductor device and a method for fabricating the same, and more particularly, to a flash memory and a method for fabricating the same, which is suitable for improving the efficiency of programming and erasing operations.

Generally, a flash memory is a nonvolatile memory that is capable of being electrically reprogrammed. The principle of programming data in a memory cell will be explained below.

For programming, hot electron injection is used similar to the process used in programming a general electrically programmable read only memory (EPROM). That is, a high voltage is applied to a control gate for the purpose of injecting electrons generated from around the drain of a memory cell into a floating gate. Accordingly, if electrons exceeding a predetermined amount are injected into the floating gate, the threshold voltage $V_{th}$ of the memory cell transistor is increased. Information in the form of a "0" or "1" is determined by the threshold voltage difference between the increased threshold voltage and the threshold voltage of the memory cell transistor into which electrons are not injected.

For reprogramming information, the threshold voltage of the memory cell transistor returns to its initial value according to the migration of electrons injected into the floating gate by means of Fowler Nordheim tunneling. This uses the flash memory's inherent erase gate.

A conventional method for fabricating a flash memory will be explained below with reference to the accompanying drawings.

FIG. 1 represents the layout of a conventional flash memory. Field oxide layers 2 are selectively formed on a substrate 1, and a first n-type polysilicon layer is patterned to form a floating gate 3. A second n-type polysilicon layer is patterned to form a control gate 4, which is aligned in a perpendicular relationship to floating gate 3.

FIGS. 2A to 2D are cross-sectional views showing a method for fabricating the conventional flash memory. Referring to FIG. 2A, a tunneling oxide layer 5 is formed on a p-type semiconductor substrate 1, and a first n-type polysilicon layer 3 for the floating gate is formed on tunneling oxide layer 5. Referring to FIG. 2B, an insulating layer 7 and second n-type polysilicon layer 4 for the control gate are sequentially formed on first n-type polysilicon layer 3.

Referring to FIG. 2C, a photoresist pattern (not shown) is formed on the second n-type polysilicon layer 4. Selective portion of the second n-type polysilicon layer 4, insulating layer 7, first n-type polysilicon layer 3 and tunneling oxide layer 5 are then removed through photolithography.

Referring to FIG. 2D, impurities are ion-implanted into substrate 1 using the second n-type polysilicon layer 4 as a mask, to form source and drain impurity regions 8 and 9. Here, source impurity region 8 is formed into a deep junction for the purpose of the erase operation of the memory cell.

The programming of the flash memory is accomplished by injecting hot electrons generated from the channel 5 into the floating gate 3. Here, the ratio of the voltage applied to the floating gate to the voltage applied to the control gate for the purpose of forming the channel is called the coupling ratio. The programming efficiency of the device is increased as the coupling ratio becomes larger. The erasure of electrons injected into the floating gate is accomplished by Fowler-Nordheim tunneling while a positive voltage is applied to the deep junction of source region 8. Here, in order to increase the erase efficiency, tunneling oxide layer 5 under the floating gate is formed to be thin, and the floating gate and control gate are formed of n-type polysilicon.

FIGS. 3A and 3B show energy band diagrams taken along line B—B' of FIG. 2D. FIG. 3A is an energy band diagram of the device in an equilibrium state. Here, when a positive voltage is applied to the source region 8 for the erase operation, the energy band diagram is changed as shown in FIG. 3B. That is, the energy band of the tunneling oxide layer 5 becomes steeply sloped according to the positive voltage applied to source region 8. By doing so, electron tunneling occurs through a thin portion of the energy barrier of the tunneling oxide layer 5 when performing the erase operation.

However, the aforementioned conventional method for fabricating the flash memory has the following problems. First, while the oxide layer under the floating gate is used as the tunneling oxide layer in order to increase the erase process efficiency, the programming efficiency is decreased. Secondly, the tunneling oxide layer is severely damaged from the hot electron injection, deteriorating the reliability of the memory cell. Thirdly, a high voltage must be applied to the source for the erase operation since the floating gate is formed of n-type polysilicon.

SUMMARY OF THE INVENTION

It is an object of the present invention to provide a flash memory and a method for fabricating the same which is suitable for increasing both programming and erasing process efficiencies even at a low voltage and therefore improving the reliability of a memory cell.

To accomplish the object of the present invention, there is provided a flash memory including: a second conductivity-type substrate having first conductivity-type first and second impurity regions spaced apart from each other by a predetermined distance; a second conductivity-type floating gate formed above part of the first impurity region; a first conductivity-type floating gate formed over the second conductivity-type floating gate; and an insulating layer and first conductivity-type control gate sequentially. formed on the first conductivity-type floating gate.

For the object of the present invention, there is further provided a method for fabricating a flash memory, including the steps of: preparing a substrate; sequentially forming a first insulating layer and first conductivity-type first semiconductor layer on the substrate excluding a portion thereof in which an erase operation occurs; sequentially forming a second insulating layer and second conductivity-type second semiconductor layer on the portion in which the erase operation occurs; forming a first conductivity-type third semiconductor layer on the first and second semiconductor layers; sequentially forming a third insulating layer and first conductivity-type fourth semiconductor layer on the third semiconductor layer to cover at least part of the first and second semiconductor layers; putting a mask over the fourth semiconductor layer, and selectively removing the first, second and third semiconductor layers to expose part of the substrate; and ion-implanting a first conductivity-type impurity into the exposed portion of the substrate to form an impurity-diffusion region.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein.

DETAILED DESCRIPTION OF PREFERRED EMBODIMENT

A flash memory cell and a method for fabricating the same in accordance with the present invention will be explained below with reference to the accompanying drawings.

Figure 1:
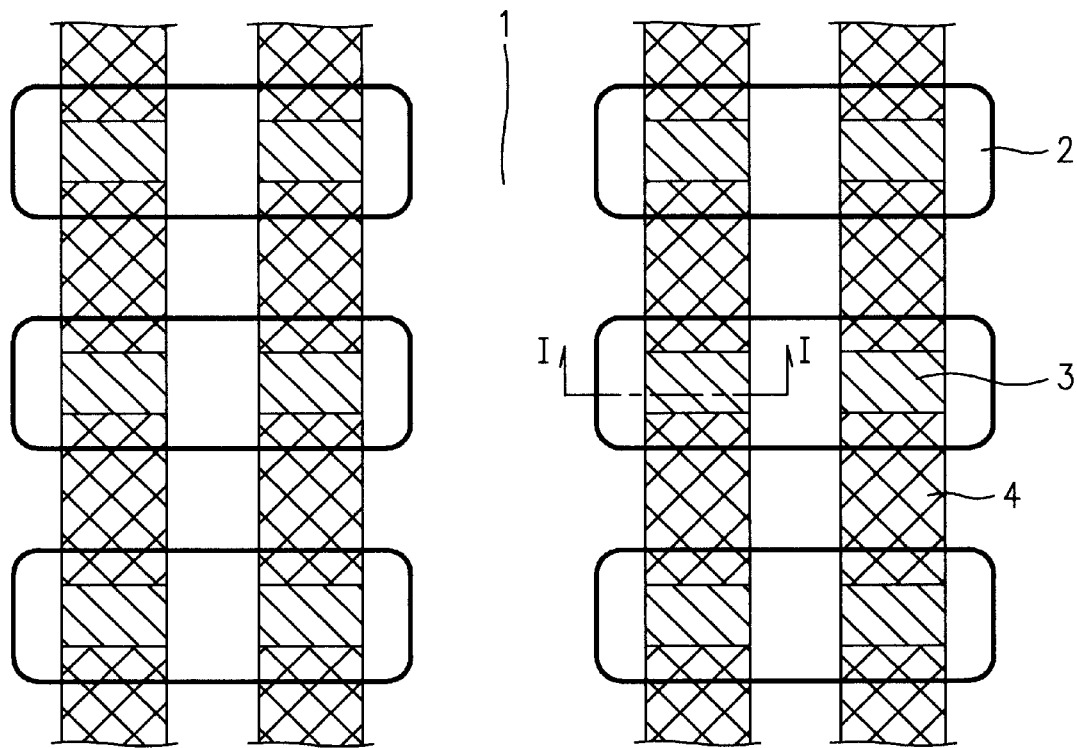
FIG. 1 is a layout of a conventional flash memory.
Figure 2A:
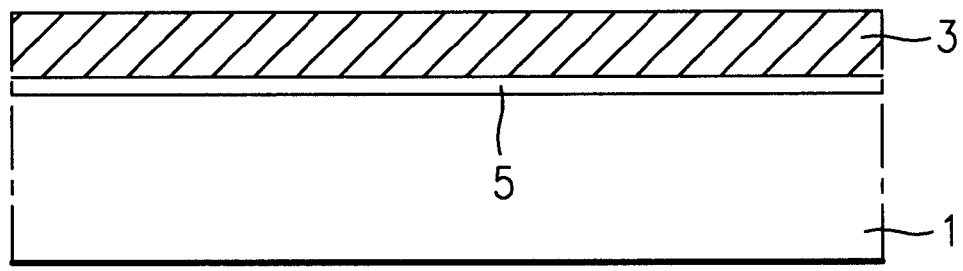
FIGS. 2A to 2D are cross-sectional views showing a method for fabricating a conventional flash memory, taken along line A—A' of FIG. 1.
Figure 2B:
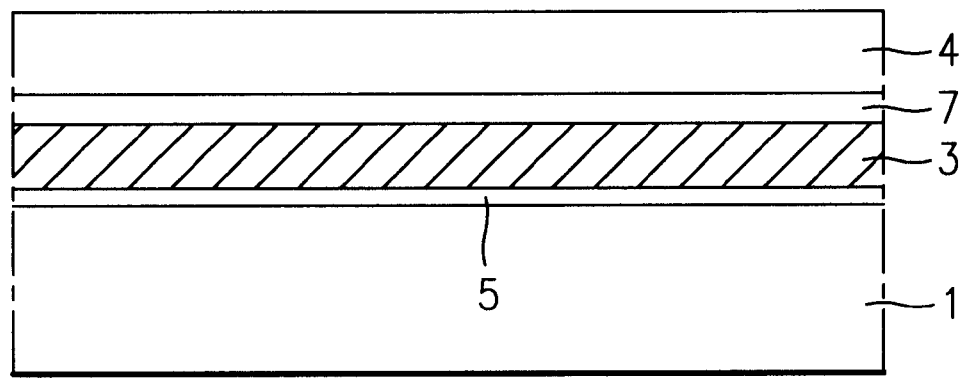
Figure 2C:
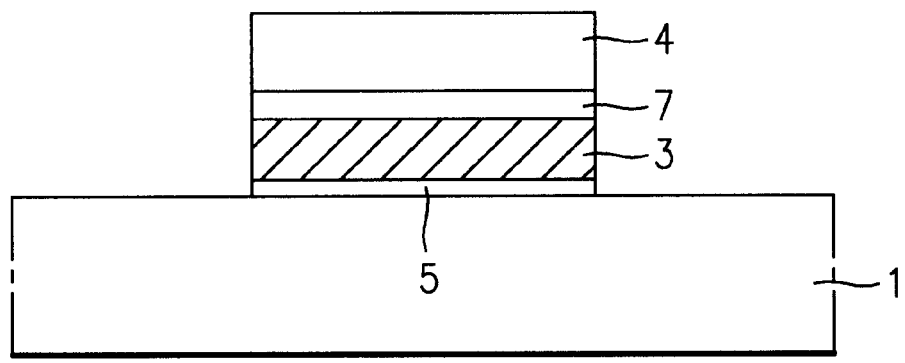
Figure 2D:
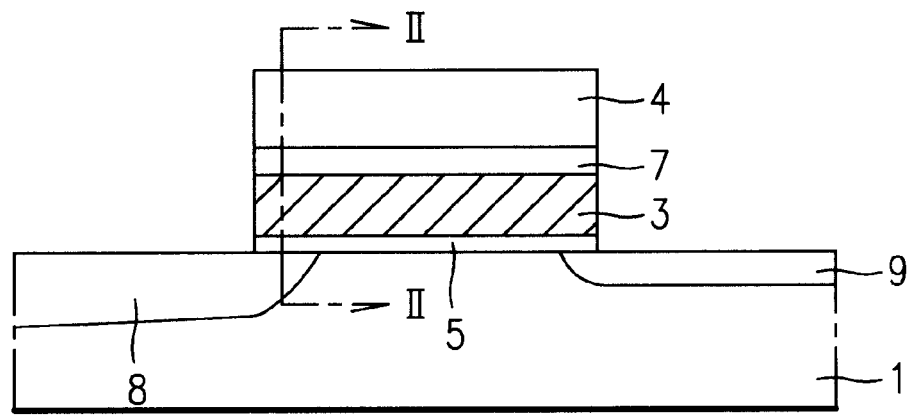
Figure 3A:
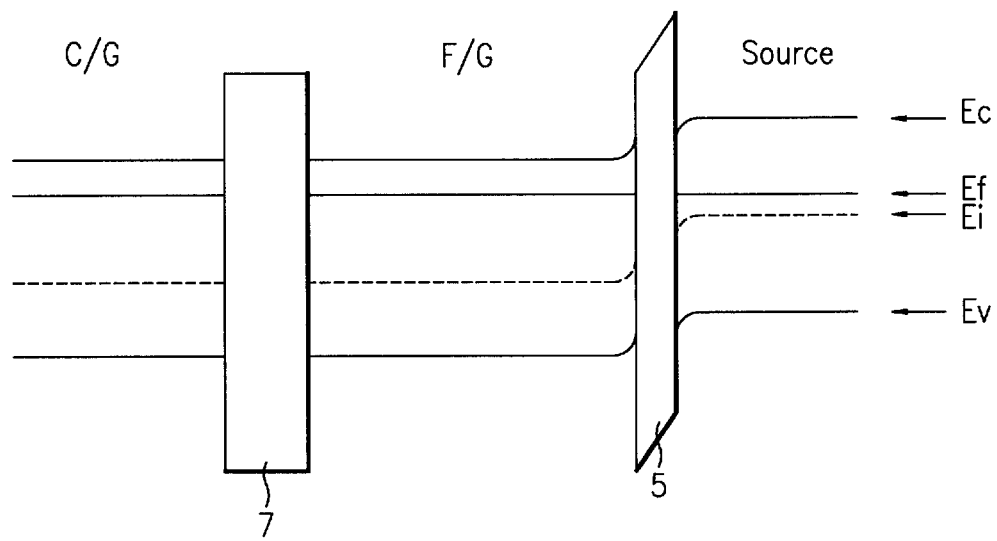
FIGS. 3A and 3B are energy band diagrams taken along line B—B' of FIG. 2D.
Figure 3B:
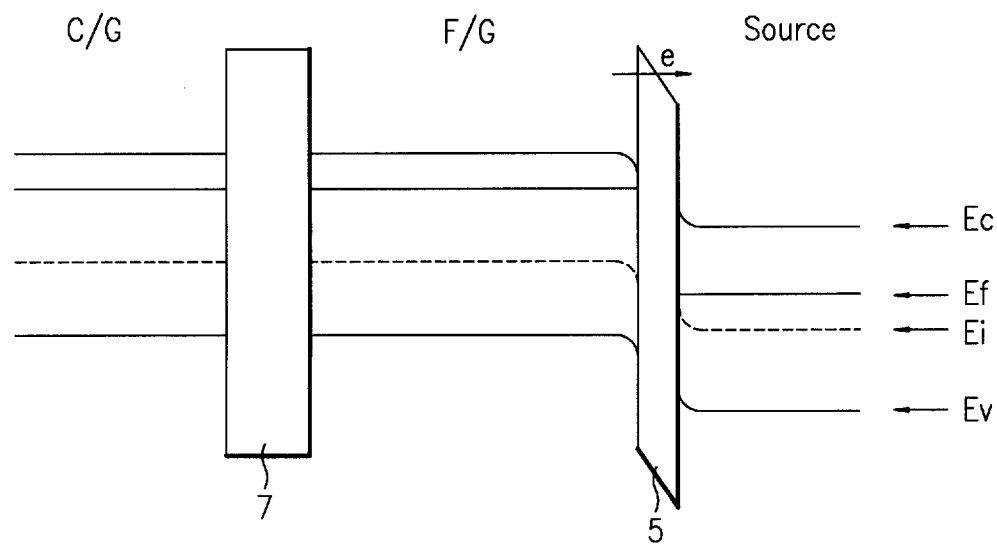
Figure 4A:
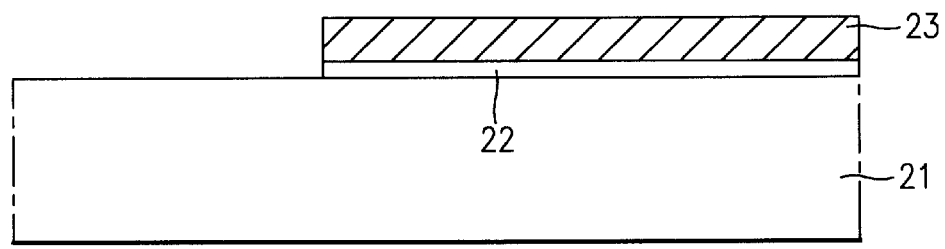
FIGS. 4A to 4F are cross-sectional views showing a method for fabricating a flash memory according to the present invention.

Referring to FIG. 4A, a first insulating layer 22 is formed on a p-type semiconductor substrate 21, and a first semiconductor layer 23 is formed on first insulating layer 22. Here, first semiconductor layer 23 has n-type conductivity. Then, a predetermined photoresist pattern (not shown) is formed on first semiconductor layer 23, and portions of first semiconductor layer 23 and first insulating layer 22 placed on substrate 21 in which the erase operation of electrons occurs are selectively removed using the photoresist pattern.

Figure 4B:
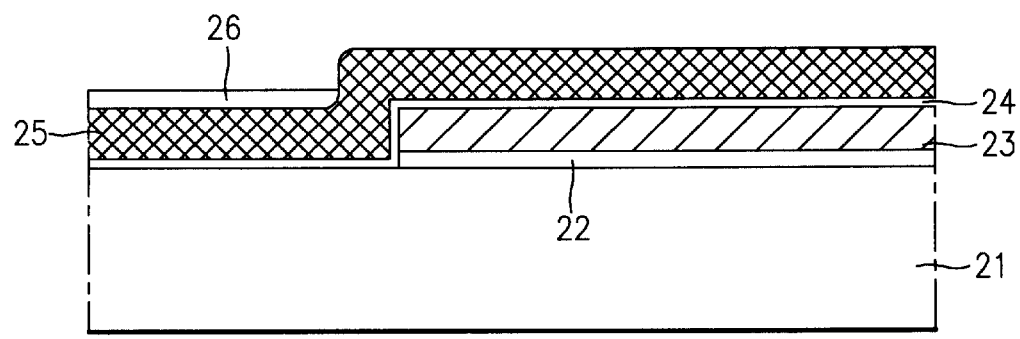

Referring to FIG. 4B, a second insulating layer 24 and second semiconductor layer 25 are sequentially formed on the overall surface of substrate 21 including first semiconductor layer 23. Here, second insulating layer 24 is used as a tunnel oxide layer, and formed to be thinner than first insulating layer 22. Second semiconductor layer 25 has p-type conductivity. Thereafter, a planarizing insulating layer 26 for planarization is formed on second semiconductor layer 25. Insulating layer 26 is formed of Boron-Phosphorous-Silicon Glass (BPSG) or Phosphorous-Silicon Glass (PSG).

Figure 4C:
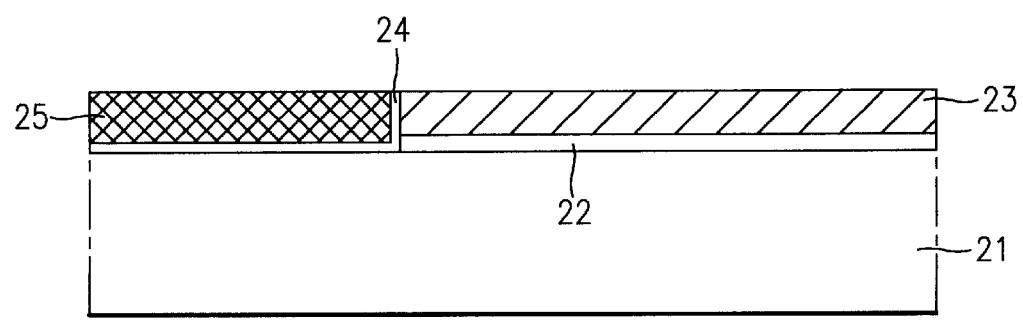

Referring to FIG. 4C, the insulating layer 26 is totally removed and portions of the second semiconductor layer 25 and second insulating layer 24 are partially removed to reduce the thickness of each of these two elements to a predetermined thickness having a height equal to that of first semiconductor layer 23.

Figure 4D:
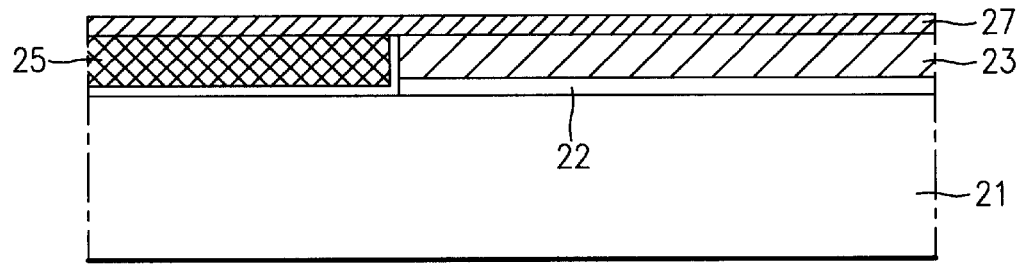

Then, referring to FIG. 4D, a third semiconductor layer 27 is formed on the overall surface of the substrate 21 including second semiconductor layer 25. Here, third semiconductor layer 27 has n-type conductivity. First, second and third semiconductor layers 23, 25 and 27 are used to form a floating gate. In one preferred embodiment, each of the layers are formed of polysilicon.

Figure 4E:
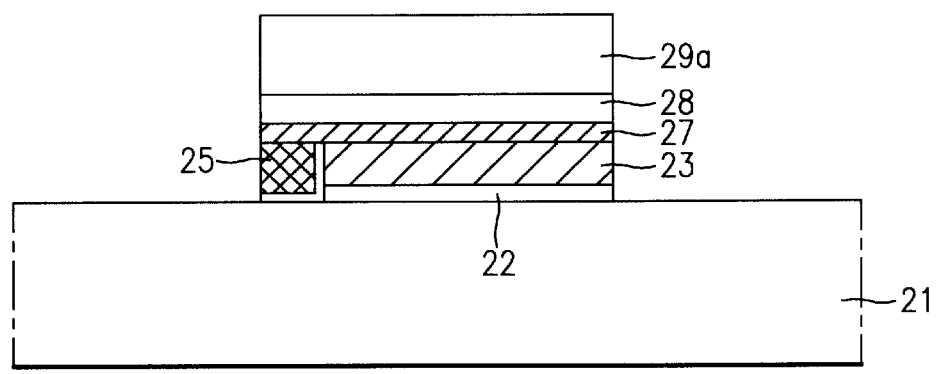

Referring to FIG. 4E, a third insulating layer 28 and fourth semiconductor layer 29 are sequentially formed on third semiconductor layer 27. Third insulating layer 28 is formed of one of the group including oxide, nitride and oxide-nitride-oxide (ONO). Fourth semiconductor layer 29 is used to form a control gate, and is formed of polysilicon.

The substrate 21 is then selectively exposed through photolithography in order to form source and drain impurity-diffusion regions. That is, portions of the first, second, third and fourth semiconductor is layers 23, 25, 27 and 29 including first, second and third insulating layers 22, 24 and 28 therebetween are selectively removed using a mask (not shown).

Figure 4F:
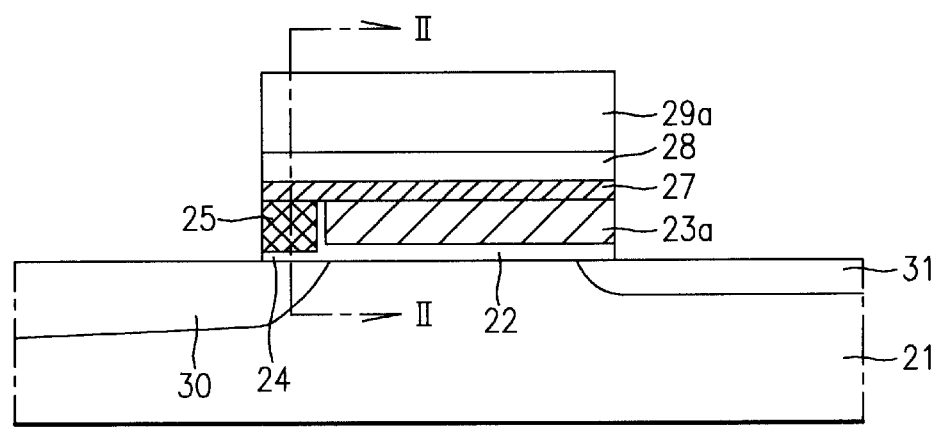

Referring to FIG. 4F, impurities are ion-implanted into substrate 21 using fourth semiconductor layer 29 as a mask, to form source and drain impurity-diffusion regions 30 and 31, respectively. Here, source impurity-diffusion region 30 is formed to be deeper than drain impurity-diffusion region 31.

Figure 5A:
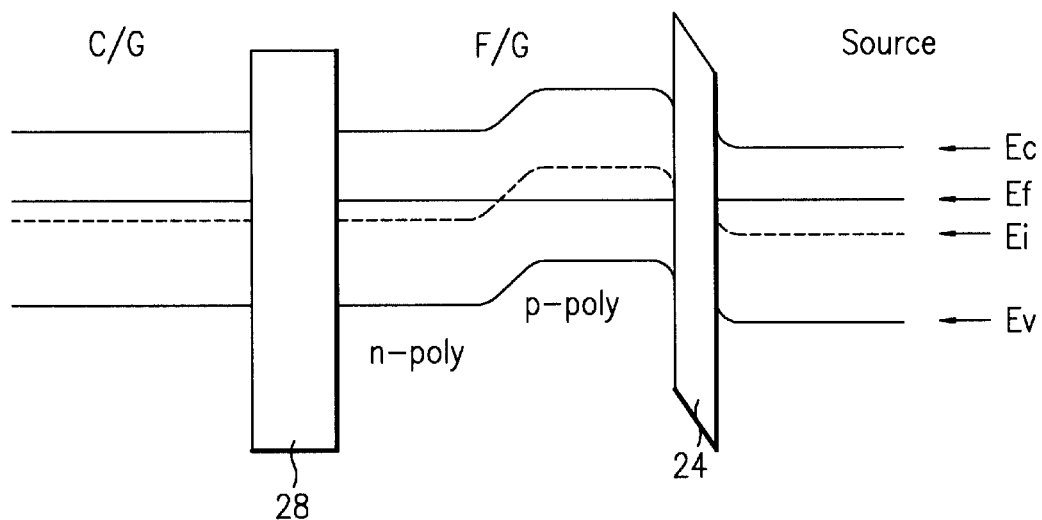
FIGS. 5A and 5B are energy band diagrams taken along line B—B' of FIG. 4F.
Figure 5B:
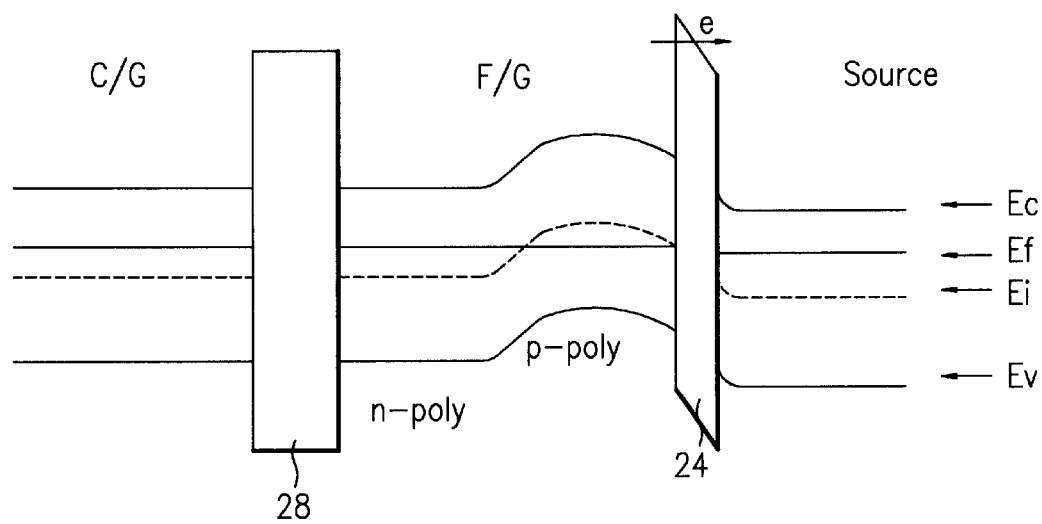

FIGS. 5A and 5B are energy band diagrams taken along line B—B' of FIG. 4F. Referring to FIG. 5A which shows an energy band diagram in an equilibrium state, the energy barrier of the tunnel oxide layer 24 is advantageous to the erase operation of electrons even in the equilibrium state due to the p-type second polysilicon layer 25. Accordingly, as shown in FIG. 5B, tunneling occurs even if a positive voltage is applied, which is lower than that where the floating layer is formed of a n-type polysilicon.

According to the above-described present invention, since the floating gate in which the erase operation of electrons is carried out is formed of p-type polysilicon, the process of erasing electrons is easy to perform. Also, the oxide layer placed on the channel adjacent to the drain is formed to be thick, into which hot electrons are injected. By so doing, it is possible to prevent the oxide layer from deteriorating due to repeated programming operations. Moreover, the coupling ratio is increased and the programming efficiency is improved.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for fabricating a flash memory, comprising:

providing a substrate;

sequentially forming a first insulating layer and a first semiconductor layer of a first conductivity-type on said substrate excluding a portion thereof through which an erase operation occurs;

sequentially forming, on said portion in which an erase operation occurs, a second insulating layer on said substrate and said first insulating layer and against said first semiconductor layer and a second semiconductor layer of a second conductivity-type on said second insulating layer;

forming a third semiconductor layer of a first conductivity-type connecting said first and second semiconductor layers;

sequentially forming a third insulating layer and a fourth semiconductor layer of a first conductivity-type on said third semiconductor layer;

masking portions of said fourth semiconductor layer, and selectively removing said first, second and third semiconductor layers to expose part of said substrate; and selectively ion-implanting a first conductivity-type impurity into said exposed portion of said substrate to form first and second impurity-diffusion regions, respectively.

2. The method for fabricating a flash memory as claimed in claim 1, wherein said first, third and fourth semiconductor layers are n-type conductivity, and said second semiconductor layer is p-type conductivity.

3. The method for fabricating a flash memory as claimed in claim 1, wherein said first insulating layer is formed to be thicker than said second insulating layer.

4. The method for fabricating a flash memory as claimed in claim 1, wherein said third insulating layer is formed of oxide, nitride or ONO.

5. The method for fabricating a flash memory as claimed in claim 1, wherein said second insulating layer is a thin tunneling oxide layer.

6. The method for fabricating a flash memory as claimed in claim 1, wherein said impurity-diffusion region is n-type.

7. The method for fabricating a flash memory as claimed in claim 1, wherein said first and second impurity-diffusion regions are used as source and drain regions, respectively.

8. The method for fabricating a flash memory as claimed in claim 1, wherein said first, second and third semiconductor layers collectively form a floating gate, and said fourth semiconductor layer forms a control gate.

9. The method for fabricating a flash memory as claimed in claim 7, wherein said source region is formed to be deeper than said drain region.

10. The method for fabricating a flash memory as claimed in claim 1, wherein forming said second insulating layer and said second semiconductor layer comprises:

sequentially forming said second insulating layer and second semiconductor layer on said first semiconductor layer, said first insulating and said substrate;

forming a planarizing insulating layer for planarization on said second semiconductor layer;

selectively removing said planarizing insulating layer to be left only on a portion of said second semiconductor layer lower than said first semiconductor layer; and removing said planarizing insulating layer, second semiconductor layer and second insulating layer to cause the second semiconductor layer to have a height equal to that of said first semiconductor layer.

11. The method for fabricating a flash memory as claimed in claim 10, wherein said planarizing insulating layer is formed of boron-phosphorous-silicon glass.

12. The method for fabricating a flash memory as claimed in claim 10, wherein said planarizing insulating layer is formed of phosphorous-silicon glass.

13. A method for fabricating a flash memory comprising:

forming a first insulating layer on a first region of a substrate;

forming a first semiconductor layer having a first conductivity type on said first insulating layer;

forming a second insulating layer over a second region of said substrate and over a sidewall of said first semiconductor layer stacked on said first insulating layer;

forming a second semiconductor layer having a second conductivity type on said second insulating layer;

forming a third semiconductor layer having said first conductivity type over said first and second semiconductor layers so as to electrically connect said first and second semiconductor layers;

forming a third insulating layer on said third semiconductor layer;

forming a fourth semiconductor layer having said first conductivity type on said third is insulating layer; and implanting a first conductivity type impurity into said substrate to form first and second impurity-diffusion regions.

* * * * *